(12) United States Patent
Wilcox et al.

(10) Patent No.: US 6,337,220 B1
(45) Date of Patent: Jan. 8, 2002

(54) ION IMPLANTER VACUUM INTEGRITY CHECK PROCESS AND APPARATUS

(75) Inventors: Donald L. Wilcox, Salt Lake City; Randy M. Underwood, Taylorsville, both of UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/796,771

(22) Filed: Feb. 28, 2001

(51) Int. Cl.$^7$ ................................................ H01L 21/66
(52) U.S. Cl. .............................. 438/14; 438/15; 438/16; 438/745; 438/327; 117/90; 502/5
(58) Field of Search .............................. 438/14, 15, 16, 438/745; 430/327; 216/57

(56) References Cited

U.S. PATENT DOCUMENTS

| | | | |
|---|---|---|---|
| 5,955,393 A | * | 9/1999 | Moskovitz et al. ............. 502/5 |
| 6,086,673 A | * | 7/2000 | Molnar ......................... 117/90 |
| 6,228,563 B1 | * | 5/2001 | Starov et al. ............... 430/327 |
| 6,239,038 B1 | * | 5/2001 | Wen ........................... 438/745 |

* cited by examiner

Primary Examiner—John F. Niebling
Assistant Examiner—Olivia Luk
(74) Attorney, Agent, or Firm—Mayumi Maeda; Townsend and Townsend and Crew, LLP

(57) ABSTRACT

An ion implanter vacuum integrity check process and apparatus that enables a vacuum integrity check at a pressure substantially below the ion implantation process pressure, while storing an ion implantation process pressure set point for a subsequent ion implantation process. An ion implanter includes an end station chamber, a high vacuum system, a disk, a gas supply system and a controller for storing at least a vacuum integrity check pressure set point and an ion implantation process pressure set point. A disk inserted into the end station is accelerated to a predetermined rotational speed, while the high vacuum system is used to pump down the end station chamber. The end station chamber is, then, purged with an inert gas for a first predetermined time period, while maintaining the disk rotational speed and continuing to pump down the end station chamber. The pressure of the end station chamber is monitored, while the disk rotational speed and pumping of the chamber are maintained. If the vacuum integrity check pressure set point was reached in the end station chamber within a second predetermined time period, then the ion implanter is considered to have acceptable vacuum integrity. If not, then the process is ended and appropriate equipment maintenance action is taken for a possible leak. The apparatus includes a controller for storing at least a vacuum integrity check pressure set point, an ion implantation process pressure set point and an over-pressure set point.

12 Claims, 3 Drawing Sheets

ION IMPLANTER VACUUM INTEGRITY CHECK PROCESS AND APPARATUS

BACKGROUND OF THE INVENTION

1. Field of the Invention

The present invention relates in general to semiconductor device manufacturing and, in particular, to apparatus and procedures for checking the vacuum integrity of ion implanters.

2. Description of the Related Art

The manufacturing of semiconductor devices often involves the processing of a semiconductor substrate (e.g., a silicon wafer) through a series of processes including the implantation of dopant ions into the semiconductor substrate. Such ion implantation processes are typically performed in an ion implanter that has been pumped down to a high vacuum state.

FIG. 1 is a sketch illustrating the subsystems of a conventional ion implanter 10. The subsystems include an ion beam line apparatus 12 for producing, analyzing and accelerating dopant ions for implantation, a disk 14 for holding semiconductor substrates and an end station chamber 16 for loading, holding and positioning disk 14. Ion implanter 10 also includes a high vacuum system 18 for evacuating ion beam line apparatus 12 and end station chamber 16, a gas supply system 20 and a computer control system (not shown) for managing the operation of ion implanter 10. See S. Wolf and R. N. Tauber, *Silicon Processing for the VLSI Era, Volume 1: Process Technology*, 308–317 (Lattice Press 1986) for a further description of ion implanters.

Gaseous contaminants can be introduced into an ion implanter through disruptions (e.g., a small leak) in the ion implanter's vacuum integrity. The gaseous contaminants can then interfere with the ion implantation process by, for example, colliding with the dopant ions. The result is undesirable variation in the electrical characteristics of the implanted semiconductor substrates. Since the electrical characteristics are typically measured after the semiconductor devices have been fully manufactured, resources can be wasted in processing semiconductor substrates that do not meet electrical requirements.

Conventional ion implanters employ two stored pressure set points: one pressure set point for controlling the ion implanter at the ion implantation process pressure (e.g., 8.5 E-5 Torr) and the other for defining an over-pressure condition (e.g., 1.4 E-4 Torr). Disruptions in vacuum integrity caused by small leaks can, however, only be detected at pressures significantly below the ion implantation process pressure and over-pressure set points. Typically, such disruptions in vacuum integrity are detected at a pressure in the vicinity of, e.g., 1.0 E-5 Torr.

Conventional ion implantation processes involve pumping down (i.e., evacuating) an ion implanter to the ion implantation process pressure and, then, implanting semiconductor substrates at that pressure. The ion implantation process pressure is maintained by introducing a high purity gas into the end station chamber of the ion implanter. The pressure in the end station chamber is monitored during the ion implantation process and compared to the over-pressure set point. If the pressure rises to the over-pressure set point (e.g., due to excessive out-gassing from photoresist on the semiconductor substrates or a large leak in the ion implanter), the ion implantation process is stopped until the ion implanter can again be pumped down to the ion implantation process pressure. A drawback of this conventional ion implantation process is its inability to attain the low pressures needed to adequately check vacuum integrity for the presence of small leaks.

A vacuum integrity check process that enables adequate detection for the presence of small leaks would entail pumping down the ion implanter to a vacuum integrity check pressure (e.g., 1.0 E-5 Torr) that is significantly lower than the ion implantation process pressure. This can be accomplished by changing the ion implantation process pressure set point to the lower vacuum integrity check pressure set point. If the vacuum integrity check pressure can be reached within a predetermined time period, then vacuum integrity is confirmed and the ion implanter is considered leak free. However, since conventional ion implanters can not store both a vacuum integrity check pressure set point and an implantation process pressure set point, an ion implantation process can not be performed following the vacuum integrity check. Vacuum integrity checks at pressures significantly below the ion implantation process pressure are, therefore, only performed on an infrequent basis (e.g., once every ten ion implantation processes). This exposes those semiconductor substrates implanted between the vacuum integrity checks to the risk of implantation in the presence of gaseous contaminants from small leaks. In addition, simply pumping down the ion implanter to the vacuum integrity check pressure takes an undesirably long time (e.g., 15 minutes) and is ineffective in removing contaminants from within the ion implanter.

Still needed in the field, therefore, are an ion implanter vacuum integrity check process and apparatus that enable a vacuum integrity check at a pressure significantly below the ion implantation process pressure, while storing an ion implantation process pressure set point for a subsequent ion implantation process. In addition, the vacuum integrity check process and apparatus should provide for the effective removal of contaminants from within the ion implanter and be of a short duration.

SUMMARY OF THE INVENTION

The present invention provides an ion implanter vacuum integrity check process and apparatus that enable a vacuum integrity check at a pressure significantly below the ion implantation process pressure, while storing an ion implantation process pressure set point for a subsequent ion implantation process. In addition, the vacuum integrity check process and apparatus provide for the effective removal of contaminants from within the ion implanter and is of short duration.

Processes in accordance with the present invention include first providing an ion implanter. The ion implanter includes an end station chamber, a high vacuum system, a disk, a gas supply system and a controller for storing at least one vacuum integrity check pressure set point and one implantation process pressure set point. The disk is, then, inserted into the end station chamber, which is subsequently sealed. Next, the disk is accelerated to a predetermined rotational speed (e.g., 953 rpm) using the controller, while the high vacuum system is used to pump down the end station chamber. Once the disk reaches the predetermined rotational speed, the end station chamber is purged with an inert gas (e.g., high purity nitrogen or argon) at a first predetermined flow rate (e.g., 15 sccm) for a first predetermined time period (e.g., 15 seconds). During this purge step, the predetermined rotational speed of the disk is maintained and the high vacuum system continues to pump down the end station chamber. Next, the pressure of the end station chamber is monitored, while maintaining the predetermined rotational speed and continuing to pump down the end station chamber. A determination is, then, made as to whether or not the pressure within the end station chamber had reached the vacuum integrity check pressure set point within a second predetermined time period. If the vacuum integrity check pressure set point had been reached, then the ion implanter is considered to have acceptable vacuum integrity. Failure for the vacuum integrity check set point to be reached within the second predetermined time period is evidence of a disruption of the ion implanter's vacuum integrity, indicating the presence of a leak.

An apparatus according to the present invention includes a controller for storing at least one each of a vacuum integrity check pressure set point, an ion implantation process pressure set point and an over-pressure set point.

A better understanding of the features and advantages of the present invention will be obtained by reference to the following detailed description that sets forth illustrative embodiments, in which the principles of the invention are utilized, and the accompanying drawings, of which:

DETAILED DESCRIPTION OF THE INVENTION

Figure 1:
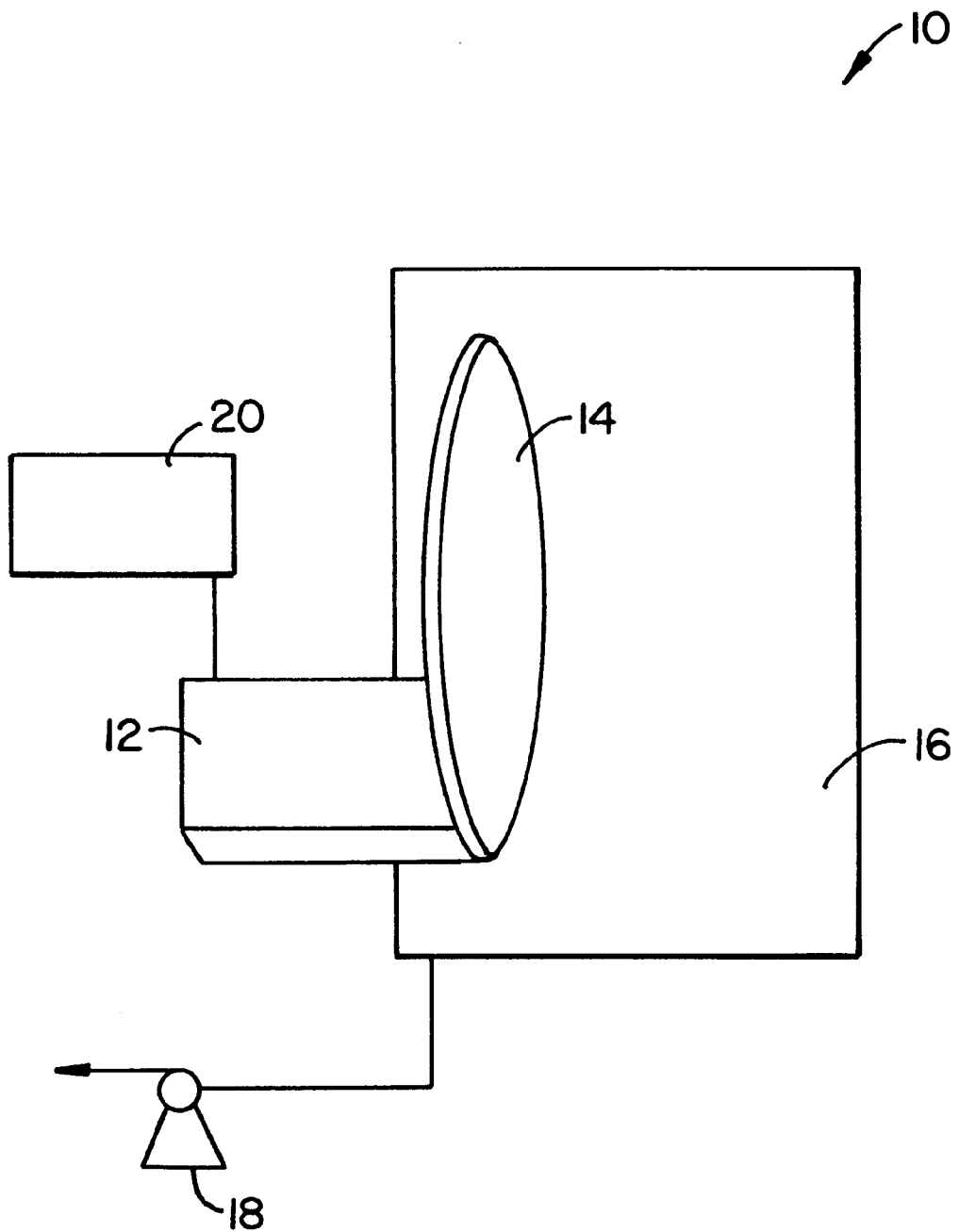
FIG. 1 is a sketch illustrating a conventional ion implanter system.
Figure 2:
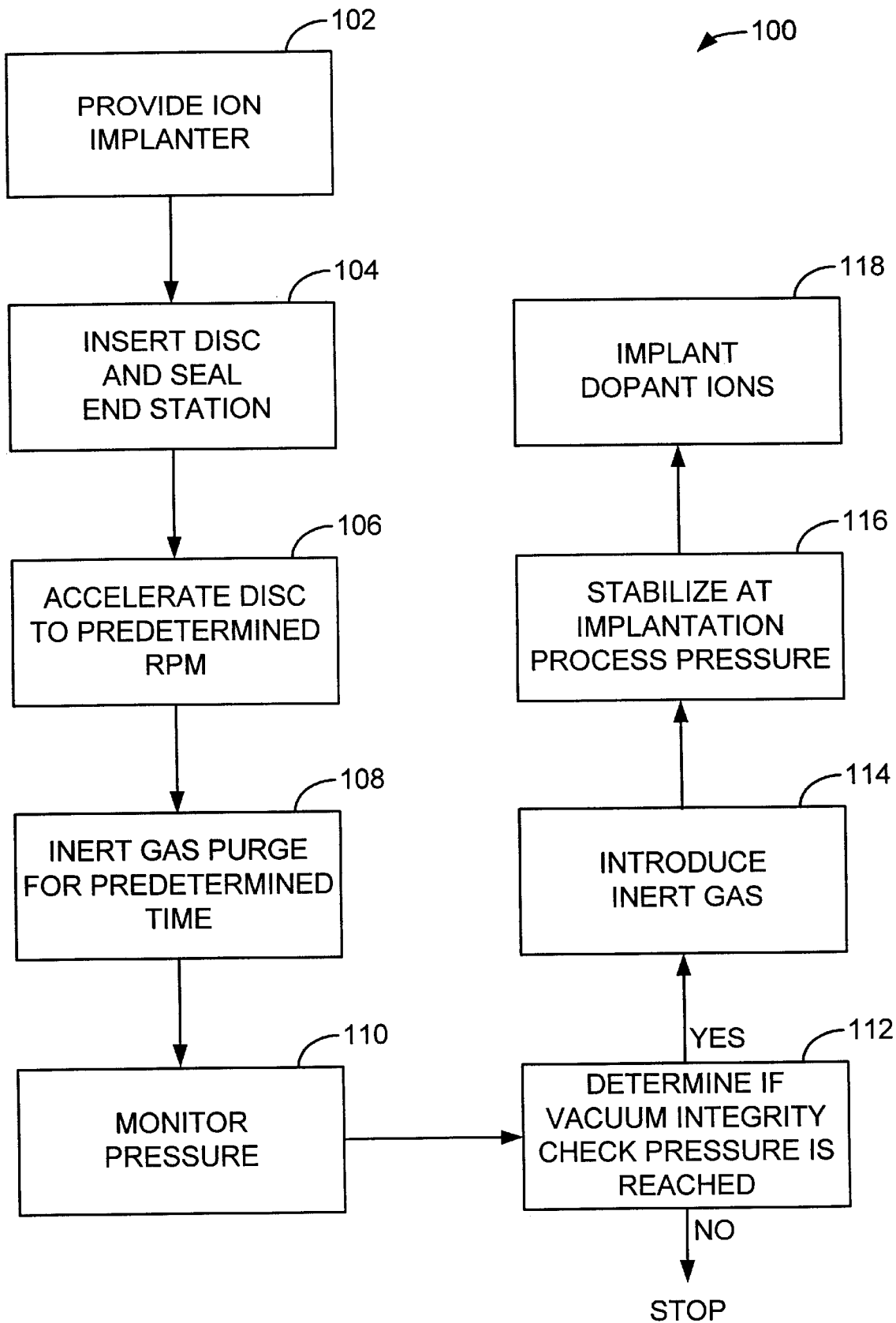
FIG. 2 is a flow diagram illustrating a sequence of steps in a process according to one embodiment of the present invention.

FIG. 2 illustrates steps in a process flow 100 in accordance with the present invention for checking the vacuum integrity of an ion implanter. First, at step 102, an ion implanter is provided. The ion implanter includes an end station chamber, a high vacuum system, a disk, an inert gas supply system and a controller. The controller is capable of at least storing a vacuum integrity check pressure set point and an ion implantation process pressure set point. The vacuum integrity check pressure set point and the ion implantation process pressure set point can be stored in a variety of different types of memory devices including, for example, Erasable Programmable Read Only Memory (EPROM) integrated circuit that would be included in the controller. The ion implanter provided in step 102 can be, for example, an Eaton NV80, Eaton NV160, or other commercially available ion implanter that has been modified to include the controller.

Next, at step 104, the disk is inserted into the end station chamber, which is subsequently sealed. If desired, the disk can hold semiconductor substrates (e.g., silicon wafers or other semiconductor wafers) from this step forward. It is preferred, although not required, that a photoresist layer not be present on the semiconductor substrates since out-gassing from the photoresist layer can lengthen the time needed for the upcoming monitoring step (described below).

The disk is then accelerated to a predetermined rotational speed using the controller, as in step 106. While the disk is being accelerated, the high vacuum system is employed to pump down (i.e., evacuate) the end station chamber of the ion implanter. The predetermined rotational speed is typically the standard rotational speed specified by the manufacturer of the ion implanter, although other rotational speeds can be employed. The predetermined rotational speed can be, for example, in the range of 951 rpm to 955 rpm. The high vacuum system can be any suitable high vacuum system known to those skilled in the art.

Next, the end station chamber is purged with an inert gas at a first predetermined flow rate (e.g., 15 sccm) for a first predetermined time period (e.g., 15 seconds), as in step 108. During this purging step, the rotational speed of the disk is maintained at the predetermined rotational speed and the high vacuum system continues to pump down the end station chamber of the ion implanter. The purging step contributes to an improvement in pumping efficiency, as well as a reduction in contamination (e.g., air molecules) in the ion implanter. The pumping efficiency is improved since the presence of the inert gas promotes viscous flow from the end station chamber to the high vacuum system. The contamination in the ion implanter is reduced since purging the end station chamber with a high purity gas sweeps contaminants from the end station chamber.

The purging step can be initiated by employing the controller to monitor the disk rotational speed (e.g., through a set point sent to a dose processor in the controller) and send appropriate signals to the gas supply system once the predetermined rotational speed has been reached. The purging step preferably employs a high purity gas that can be easily pumped and that promotes significant viscous flow (e.g., $N_2$ or Ar gas of at least 99.99% purity). The flow rate of the high purity gas is in the range of, for example, 13 sccm to 17 sccm. Maintaining the predetermined disk rotational speed serves to force the high purity gas and contaminants towards the high vacuum system.

Next, at step 110, the pressure of the end station chamber is monitored, while maintaining the predetermined rotational speed of the disk and continuing to pump down the end station chamber. At this step, the end station chamber is pumped down to the vacuum integrity check pressure set point in the absence of inert gas flow. In order to pump down to the vacuum integrity check pressure set point, the ion implantation process pressure set point (which is higher than the vacuum integrity check pressure set point) is disabled by the controller.

A determination is then made, as shown at step 112, as to whether the pressure in the end station chamber has reached the vacuum integrity check pressure set point within a second predetermined time period. A typical vacuum integrity check pressure set point is, for example, 1.0 E-5 Torr. Although the second predetermined time period is dependent on the size and speed of the high vacuum system, the second predetermined time period for that pressure can be, for example, less than 1 minute. Vacuum integrity check pressure set points of less than 1.0 E-5 Torr can be employed in the present inventive processes, but the length of the second predetermined time period would increase accordingly. Vacuum integrity check pressure set points of greater than 1.0 E-5 Torr can also be employed. But the ability to detect small leaks is reduced as the vacuum integrity check pressure is raised above 1.0 E-5 Torr.

Employing a purge step 108 prior to the monitoring step 110 and the determining step 112 significantly reduces the time required to reach the vacuum integrity check pressure set point, in comparison to a conventional process that simply pumps the end station chamber directly down to the set point without such a purge step. For example, an ion implanter that requires 15 minutes to pump down the end station chamber to 1.0 E-5 Torr without a purge step can require only 1 minute when a purge step is employed in accordance with the present invention.

If the vacuum integrity check pressure set point is not reached within the second predetermined time period, then the ion implanter likely has a disruption to its vacuum integrity (e.g., a leak) and the process is, therefore, ended and appropriate equipment maintenance action is taken. However, if it has been determined in the determining step 112 that the pressure within the end station chamber has reached the vacuum integrity check pressure set point within the second predetermined time period, then an inert gas (e.g., Ar or $N_2$) is introduced into the end station chamber at a second predetermined flow rate, as shown at step 114, to elevate the pressure to the ion implantation process pressure set point. During this step, the predetermined rotational speed of the disk is maintained and the high vacuum system continues to pump down the end station chamber.

Next, the pressure in the end station chamber is stabilized at the implantation process pressure set point (e.g., 8.5 E-5 Torr), as shown at step 116. This stabilization step can be accomplished, for example, by employing the controller to re-enable the implantation process pressure set point and disable the vacuum integrity check pressure set point. The stabilization of the pressure within the end station chamber avoids any unintended over-pressurization events during the subsequent ion implantation step. Dopant ions are, then, implanted into semiconductor wafers (e.g., silicon wafers) held on the disk, as shown at step 118.

Since processes according to the present invention can achieve the vacuum integrity check pressure in a relatively short period of time and still stabilize at the implantation process pressure set point in subsequent steps, the ion implanter can be adequately checked for leaks every time a disk is introduced into the end station chamber. This eliminates the exposure of those semiconductor substrates implanted between the vacuum integrity checks to the possible risk of implantation in the presence of gaseous contaminants from small leaks. In addition, the purge step 108 in processes according to the present invention serves to further reduce the level of contaminants within the ion implanter.

Figure 3:
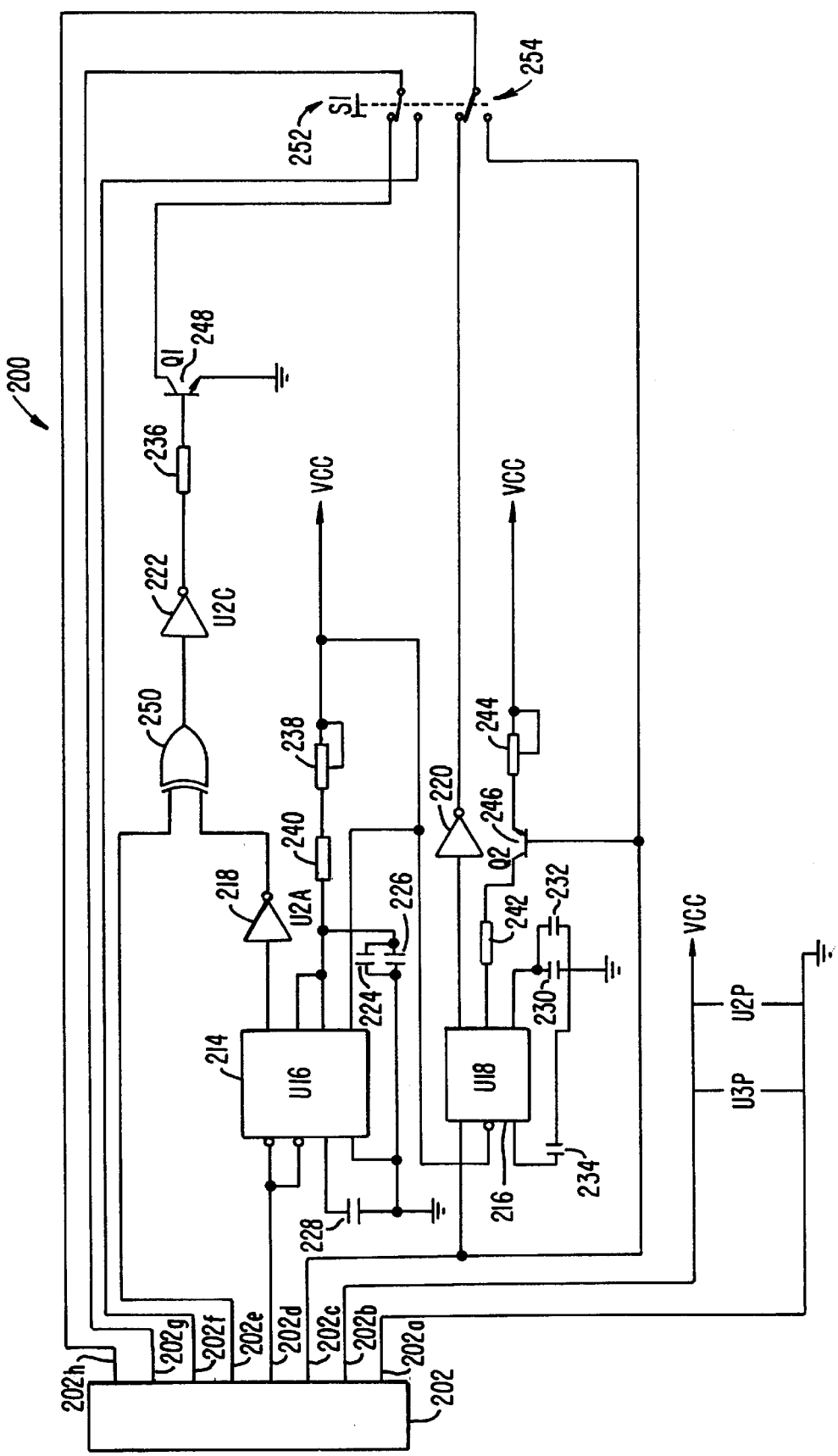
FIG. 3 is an electrical schematic illustrating an exemplary circuit board for use in an apparatus according to the present invention.

Also provided is an apparatus for controlling an ion implanter that includes a controller for storing at least a vacuum check pressure set point and an ion implantation process pressure set point. FIG. 3 is an electrical schematic illustrating the circuitry 200 for use in an apparatus according to one exemplary embodiment of the present invention. Circuitry 200 includes a terminal block 202 with eight terminal connectors 202a–202h. Terminal connector 202a is configured to be connected to ground (GND), while terminal connector 202b is connected to Vcc (the primary voltage supply signal for the circuit). Terminal 202c is configured to receive a signal from a first low vacuum sensor (e.g., a 1.0 E-5 Torr sensor) corresponding to the vacuum integrity cheek pressure set point. Terminal 202d is configured to receive a signal from a disk rotation sensor, while terminal 202e is configured to receive a signal from a second low vacuum sensor (e.g., a 8.5 E-5 Torr sensor) corresponding to the ion implantation process pressure set point. Terminal connectors 202f–202h are configured to provide signals from the circuit board to the ion implanter, to a gas flow controller (e.g., a Mass Flow Controller [MFC]) in the ion implanter's gas supply system and to a dose controller, respectively.

Circuitry 200 also includes interconnected timer integrated circuits 214 and 216 (i.e., 556N timer integrator circuits available, for example, from National Semiconductor Corporation). The circuit board also includes single input logic gates 218, 220 and 222, capacitors 224, 226, 228, 230, 232 and 234, resistors 236, 238, 240, 242 and 244, bipolar transistors 246 and 248, dual input logic gate 250 and switches 252 and 254. Suitable single input and dual input logic gates and bipolar transistors are available from, for example, National Semiconductor Corporation.

Circuitry 200 is configured to receive signals from a first low vacuum sensor, a second low vacuum sensor and a disk run speed sensor (i.e., disk rotational speed sensor) and to process these signals such that (i) a purge signal is sent to the gas flow controller when the disk rotational speed has accelerated to a predetermined disk rotational speed, (ii) an ion implantation process pressure set point (e.g., a set point of 8.5 E-5 Torr) is disabled when the ion implanter is initially being pumped down to a vacuum integrity check pressure set point (e.g., a set point of 1.0 E-5 Torr), and (iii) the ion implantation process pressure set point is re-enabled after the vacuum integrity pressure set point has been reached. In this regard, the ion implantation process pressure set point and the vacuum integrity process pressure set point can be stored, for example, in an EPROM integrated circuit in the controller. The purge signal sent to the gas flow controller can, for example, activate an MFC and, thereby, provide a flow of a high purity gas (e.g., 99.99% $N_2$ or Ar) for a predetermined time period (e.g., the 10 to 15 second time period described in connection with the purging step 108 above) to purge contaminants from the end station chamber of the ion implanter.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for checking the vacuum integrity of an ion implanter and purging the ion implanter of contaminants, the method comprising:

inserting a disk into, and sealing, an end station chamber of the ion implanter;

accelerating the disk to a predetermined rotational speed and pumping down the end station chamber;

purging the end station chamber with an inert gas at a first predetermined flow rate for a first predetermined time period, while maintaining the predetermined rotational speed of the disk and continuing to pump down the end station chamber;

monitoring the pressure of the end station chamber, while maintaining the predetermined rotational speed of the disk and continuing to pump down the end station chamber; and determining whether the pressure in the end station chamber reached the vacuum integrity check pressure set point within a second predetermined time period.

2. The method of claim 1 further comprising, during the monitoring step, disabling the ion implantation process pressure set point and enabling the vacuum integrity check pressure set point.

3. The method of claim 1, wherein the purging step purges the end station chamber with nitrogen gas with a purity of at least 99.99%.

4. The method of claim 1, wherein the purging step purges the end station chamber with argon gas with a purity of at least 99.99%.

5. The method of claim 1, wherein the first predetermined time period is in the range of 10 seconds to 15 seconds.

6. The method of claim 1, wherein the second predetermined time period is less than 1 minute.

7. The method of claim 1, wherein the predetermined rotational speed is in the range of 951 rpm to 955 rpm.

8. The method of claim 1, further comprising storing at least a vacuum integrity check pressure set point and an implantation process pressure set point, wherein the vacuum integrity check pressure set point is less then the implantation process pressure set point.

9. The method of claim 8, wherein the vacuum integrity check pressure set point is 1.0 E-5 Torr and the ion implantation process pressure set point is 8.5 E-5 Torr.

10. The method of claim 1, wherein the inserting step includes inserting a disk with semiconductor wafers mounted thereon into the end station chamber, and wherein the method further includes the steps of:
introducing, when it has been determined in the determining step that the pressure in the end station chamber has reached the vacuum integrity check pressure set point within the second predetermined time period, an inert gas into the end station chamber at a second predetermined flow rate, while maintaining the predetermined rotational speed of the disk and continuing to use the high vacuum system to pump down the end station chamber;

stabilizing the pressure in the end station chamber at the implantation process pressure set point; and implanting dopant ions into the semiconductor wafers.

11. The method of claim 10, further comprising, during the stabilizing step, disabling the vacuum integrity check pressure set point and enabling the ion implantation process pressure set point.

12. The method of claim 1, further comprising storing an over-pressure set point.

* * * * *